(12) United States Patent
Wang et al.

(10) Patent No.: US 9,711,356 B2
(45) Date of Patent: Jul. 18, 2017

(54) METHOD FOR MANUFACTURING THIN-FILM TRANSISTOR BY IMPLANTING IONS INTO CHANNEL REGION FOR LOWERING LEAKAGE CURRENT

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Huibin Guo, Beijing (CN); Xiaowei Liu, Beijing (CN); Yuchun Feng, Beijing (CN); Zongjie Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 10 days.

(21) Appl. No.: 14/466,218

(22) Filed: Aug. 22, 2014

(65) Prior Publication Data
US 2015/0236128 A1    Aug. 20, 2015

(30) Foreign Application Priority Data
Feb. 18, 2014    (CN) .......................... 2014 1 0054172

(51) Int. Cl.
*H01L 21/02*    (2006.01)
*H01L 21/225*    (2006.01)
(Continued)

(52) U.S. Cl.
CPC .. *H01L 21/02694* (2013.01); *H01L 21/02592* (2013.01); *H01L 21/2253* (2013.01);
(Continued)

(58) Field of Classification Search
None
See application file for complete search history.

(56) References Cited

U.S. PATENT DOCUMENTS

| | | | |
|---|---|---|---|
| 5,047,360 A | * | 9/1991 | Nicholas .............. G02F 1/1368 148/DIG. 105 |
| 5,559,344 A | * | 9/1996 | Kawachi ............ H01L 21/2236 257/57 |

(Continued)

FOREIGN PATENT DOCUMENTS

| | | |
|---|---|---|
| CN | 101419973 A | 4/2009 |
| CN | 102176413 A | 9/2011 |

OTHER PUBLICATIONS

Jokinen, J. et al. In "Comparison of TOF-ERDA and nuclear resonance reaction techniques for range profile measurements of keV energy implants," Nuclear Instruments and Methods in Physics Research B, 119 (1996) 553-542.*

(Continued)

*Primary Examiner* — Michael Jung
(74) *Attorney, Agent, or Firm* — Harness, Dickey & Pierce, P.L.C.

(57) ABSTRACT

The present invention discloses a method for manufacturing a thin-film transistor, comprising the steps of: forming a semiconductor active layer, and a doped semiconductor active layer; forming a source-drain metal layer; forming a channel region; and implanting ions for lowering the TFT leakage current into the surface of the semiconductor active layer in the channel region via ion implantation after forming the channel region. The invention further relates to a thin-film transistor, a TFT array substrate and a display device. The invention has the following beneficial effects: by implanting ions for lowering the TFT leakage current into the channel region, the electrical performance of a TFT may (Continued)

be improved, and the thickness of a semiconductor active layer in a channel region may be changed controllably.

14 Claims, 3 Drawing Sheets

(51) Int. Cl.
  *H01L 21/265* (2006.01)
  *H01L 27/12* (2006.01)
  *H01L 29/66* (2006.01)
  *H01L 29/786* (2006.01)

(52) U.S. Cl.
  CPC ...... *H01L 21/265* (2013.01); *H01L 21/26513* (2013.01); *H01L 27/127* (2013.01); *H01L 27/1214* (2013.01); *H01L 29/66742* (2013.01); *H01L 29/66765* (2013.01); *H01L 29/786* (2013.01); *H01L 29/78669* (2013.01); *H01L 29/78696* (2013.01)

(56) References Cited

U.S. PATENT DOCUMENTS

| | | | | |
|---|---|---|---|---|
| 5,897,346 | A | * | 4/1999 | Yamaguchi ......... H01L 21/3003 257/E21.212 |
| 2002/0171084 | A1 | | 11/2002 | Yasuda et al. |
| 2007/0161165 | A1 | * | 7/2007 | Liu .................. H01L 29/66757 438/151 |
| 2008/0197356 | A1 | * | 8/2008 | Kim ........................ H01L 27/12 257/71 |
| 2009/0065784 | A1 | * | 3/2009 | Kobayashi .............. H01L 29/04 257/72 |
| 2010/0117074 | A1 | * | 5/2010 | Yamazaki ......... H01L 29/66742 257/43 |

OTHER PUBLICATIONS

First Office Action regarding Chinese application No. 201410054172.7, dated Dec. 29, 2015. Translation provided by Dragon Intellectual Property Law Firm.

Second Office Action regarding Chinese application No. 201410054172.7, dated Aug. 8, 2016. Translation provided by Dragon Intellectual Property Law Firm.

Chul Ho Park, Young Seok Choi, Hee Young Kwack et al, Basic Design for Half Tone Performance of Organic Insulation Negative PAC for the Novel IPS Structure, *SID 2014 Digest*, 1209-1211.

A. Kuo, T.K. Won, J.Kanicki, Back channel etch chemistry of advanced a-Si H TFTs, *Microelectronic Engineering* 88 (2011), 207-212.

* cited by examiner

US 9,711,356 B2

METHOD FOR MANUFACTURING THIN-FILM TRANSISTOR BY IMPLANTING IONS INTO CHANNEL REGION FOR LOWERING LEAKAGE CURRENT

CROSS REFERENCE OF THE RELATED APPLICATION

The present application claims priority to the Chinese application No. 201410054172.7 filed on Feb. 18, 2014, entitled with "Thin-film Transistor and Method for Manufacturing the Same, TFT Array Substrate and Display Device", the entire contents of which are incorporated herein by reference.

FIELD OF THE INVENTION

The present invention relates to the field of liquid crystal display technologies, and in particular, to a thin-film transistor and a method for manufacturing the same, a TFT array substrate and a display device including the thin-film transistor.

DESCRIPTION OF THE PRIOR ART

Due to the features of small volume, low power consumption and no radiation, Thin Film Transistor Liquid Crystal Display (TFT-LCD) takes a leading position in the current market of flat-panel displays. A homogeneous display picture, a high resolution and no interference are the key requirements of a high-quality TFT-LCD, and an electrical parameter, i.e., leakage current ($I_{off}$), is highly related thereto. Leakage current is an important parameter of TFT, and if leakage current is too large, the switching characteristic of the TFT will be influenced, and display defects such as inhomogeneous display, whiteness and interference, etc., may occur on a TFT-LCD.

For the products of an amorphous silicon TFT-LCD that are designed currently, after back channel etching is employed, the surface layer of the channel region will be an amorphous silicon layer, and if a problem arises in the film quality in this region, the performance of the TFT will be greatly influenced.

SUMMARY OF THE INVENTION

In order to solve the above technical problem, the invention provides a method for manufacturing a thin-film transistor, thereby the film quality in the channel region may be improved, while other regions of the film layer will not be influenced.

Further, the invention provides a thin-film transistor manufactured by the above method, and a TFT array substrate and a display device including the thin-film transistor.

To attain the above object, the invention employs the following technical solutions:

According to an embodiment of the invention, the invention provide a method for manufacturing a thin-film transistor, comprising the steps of:

forming a semiconductor active layer and a doped semiconductor active layer;

forming a source-drain metal layer;

forming a channel region; and implanting ions for lowering the TFT leakage current into the surface of the semiconductor active layer in the channel region via ion implantation after forming the channel region.

In an embodiment of the invention, the ions are N ions, C ions or H ions.

In an embodiment of the invention, the method for manufacturing a thin-film transistor comprises:

depositing a gate metal layer on a substrate, and obtaining a gate electrode pattern via a patterning process; and depositing a gate insulating layer, a semiconductor active layer, a doped semiconductor active layer and a source-drain metal layer on the gate electrode, obtaining a channel region and a pattern of a source electrode and a drain electrode via a patterning process, and implanting ions for lowering the TFT leakage current into the surface of the semiconductor active layer in the channel region via ion implantation before peeling off a photoresist on the pattern of the source electrode and the drain electrode.

In an embodiment of the invention, the method for manufacturing a thin-film transistor comprises:

depositing a source-drain metal layer on a substrate, and obtaining a pattern of a source electrode and a drain electrode via a patterning process;

forming a doped semiconductor active layer and a semiconductor active layer on the source electrode and the drain electrode, and forming a channel region via a patterning process; and implanting ions for lowering the TFT leakage current into the surface of the semiconductor active layer in the channel region via ion implantation.

In an embodiment of the invention, the energy of implanted ions during ion implantation is in the range from 20 KV to 80 KV.

In an embodiment of the invention, the dosage of implanted ions during ion implantation is in the range from $2\times10^{17}/cm^2$-$5\times10^{18}/cm^2$.

According to another embodiment of the invention, the invention further provides a thin-film transistor, which is manufactured by the above method for manufacturing a thin-film transistor.

In an embodiment of the invention, when the ions are N ions, the contents of Si, H and N contained in the ion-implanted part of the semiconductor active layer are 30 mol %-50 mol %, 4 mol %-15 mol % and 35 mol %-60 mol %, respectively.

In an embodiment of the invention, when the ions are C ions, the contents of Si, H and C contained in the ion-implanted part of the semiconductor active layer are 30 mol %-50 mol %, 4 mol %-15 mol % and 40 mol %-60 mol %, respectively.

According to another embodiment of the invention, the invention further provides a TFT array substrate, which comprises the above thin-film transistor.

According to another embodiment of the invention, the invention further provides a display device, which comprises the above TFT array substrate.

The invention has the following beneficial effects: by implanting ions for lowering the TFT leakage current into the channel region, the electrical performance of a TFT may be improved, and the thickness of a semiconductor active layer in a channel region may be changed controllably.

DETAILED DESCRIPTION OF THE PREFERRED EMBODIMENTS

Figure 1:
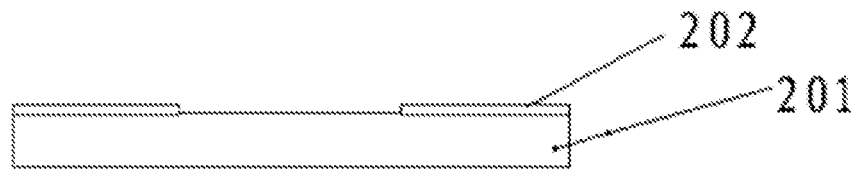
FIG. 1 shows a structural representation of a TFT array substrate according to an embodiment of the invention after a common electrode pattern is formed.

Hereafter, the characteristics and principles of the invention will be illustrated in detail in conjunction with the drawings, and the embodiment listed is only used for explaining the invention, rather than limiting the protection scope of the invention thereto.

According to an embodiment of the invention, the invention provides a method for manufacturing a thin-film transistor, which includes the steps of:

forming a semiconductor active layer and a doped semiconductor active layer;

forming a source-drain metal layer;

forming a channel region; and implanting ions for lowering the TFT leakage current into the surface of the semiconductor active layer in the channel region via ion implantation after forming the channel region.

According to the locations of the gate electrode, the source electrode and the drain electrode, thin-film transistor may be divided into top-gate structure and bottom-gate structure. A method for manufacturing a thin-film transistor with a bottom-gate structure includes:

Step 1: depositing a common electrode metal layer on a substrate, and obtaining a common electrode pattern via a patterning process;

The common electrode metal layer may be a transparent conductive film. The transparent conductive film may be made of a material such as tin indium oxide (ITO), zinc indium oxide and zinc aluminium oxide. The process for forming the common electrode metal layer may be a sputtering deposition or other processes known by one skilled in the art. A pattern of a transparent common electrode may be formed via pattern exposing by an exposing machine and etching by an etching solution.

Step 2: depositing a gate metal layer on a substrate, and obtaining a gate electrode pattern via a patterning process;

The material of the gate metal layer may be a metal, for example, molybdenum, aluminium, aluminium-nickel alloy, molybdenum-tungsten alloy, chromium or copper, etc., or a combination thereof. The process for forming the gate metal layer may be a sputtering deposition or other processes known by one skilled in the art. A gate electrode pattern is formed via pattern exposing by an exposing machine and etching by an etching solution.

Step 3: depositing a gate insulating layer, a semiconductor active layer, a doped semiconductor active layer and a source-drain metal layer on the gate electrode, obtaining a channel region and a pattern of a source electrode and a drain electrode via a patterning process, and implanting ions for lowering the TFT leakage current into the surface of the semiconductor active layer in the channel region via ion implantation before peeling off a photoresist on the pattern of the source electrode and the drain electrode;

$SiN_x$, a-Si:H and $n^+$a-Si:H are deposited via chemical vapor deposition as a gate insulating layer, a semiconductor active layer and a doped semiconductor active layer, respectively. Then a metal layer is deposited via sputtering to form a source-drain metal layer, and then a TFT channel region is formed via pattern exposing by an exposing machine and etching. The material of the source-drain metal layer may be a metal, for example, molybdenum, aluminium, aluminium-nickel alloy, molybdenum-tungsten alloy, chromium or copper, etc., or a combination thereof. The material of the gate insulating layer may be an oxide, a nitride or an oxynitride.

Step 4: forming a pattern, which includes a passivation layer with a contact hole, on the source electrode and the drain electrode, wherein the passivation layer may protect the TFT channel region and prevent the corrosion of matters such as moisture.

Step 5: forming a pattern of a pixel electrode on the passivation layer, wherein the pixel electrode is connected with the drain electrode via the contact hole.

A transparent conductive film is deposited on the passivation layer, wherein the material of the transparent conductive film may be made of a material such as tin indium oxide (ITO), zinc indium oxide and zinc aluminium oxide. The process for forming the conductive film may be a sputtering deposition or other processes known by one skilled in the art. A pattern of a transparent pixel electrode is formed via pattern exposing by an exposing machine and etching by an etching solution.

A method for manufacturing a thin-film transistor with a top-gate structure specifically includes:

Step 1: depositing a metal layer on a substrate, and obtaining a pattern of a pixel electrode via a patterning process;

A transparent conductive film is deposited, wherein the material of the transparent conductive film may be made of a material such as tin indium oxide (ITO), zinc indium oxide and zinc aluminium oxide. The process for forming the conductive film may be a sputtering deposition or other processes known by one skilled in the art. A pattern of a transparent pixel electrode is formed via pattern exposing by an exposing machine and etching by an etching solution.

Step 2: depositing a source-drain metal layer on a substrate, and obtaining a pattern of a source electrode and a drain electrode via a patterning process;

A metal layer is deposited via sputtering to form a source-drain metal layer. The material of the source-drain metal layer may be a metal, for example, molybdenum, aluminium, aluminium-nickel alloy, molybdenum-tungsten alloy, chromium or copper, etc., or a combination thereof.

Step 3: forming a doped semiconductor active layer and a semiconductor active layer on the source electrode and the drain electrode, and forming a channel region via a patterning process;

$SiN_x$, a-Si:H and $n^+$ a-Si:H are deposited via chemical vapor deposition as a gate insulating layer, a semiconductor active layer and a doped semiconductor active layer, respectively. Then N ions are implanted into the channel region, so that the component of a part of the film layer on its surface is converted into SiNx, thus the stability of the channel surface layer may be improved; however, H ions and C ions, etc., may also be implanted to improve the stability of the surface layer of the channel region.

Step 4: forming a gate insulating layer and a gate pattern on the semiconductor active layer via a patterning process.

The technical solutions in the embodiments of the invention will be described below clearly and fully in conjunction with the drawings in the embodiments of the invention by taking a thin-film transistor with a bottom-gate structure as an example. Apparently, the embodiments described are only a part of the embodiments of the invention, rather than being the whole embodiments. Other embodiments obtained by one of ordinary skills in the art without creative work all pertain to the protection scope of the invention.

In the embodiments of the invention, a patterning process refers to a process for forming a pattern, including exposing, developing and etching, etc.; source-drain metal layer refers to a metal that forms a source electrode and a drain electrode; and one-time patterning process refers to a patterning process that employs one mask.

One embodiment of the invention provides a method for manufacturing a TFT array substrate, which will be illustrated in detail referring to FIG. 1-FIG. 6.

Step 1: forming a common electrode pattern;

This step may be realized by any prior art that may be implemented via a one-time patterning process. For example, it may be realized via a normal masking process; as shown in FIG. 1, a metal layer (not shown) on a base substrate 201 may be patterned with the aid of a normal mask (not shown) to form a pattern of a patterned common electrode 202. Specifically, it includes: depositing a common electrode metal layer on a substrate, and exposing, developing and etching via a normal mask to obtain a common electrode pattern.

A normal (conventional) mask refers to a mask with a light transmitting region and a light shielding region that is generally used. After a photoresist layer formed on a common electrode metal layer is exposed and developed with the aid of a first conventional mask, the common electrode metal layer to be reserved is covered with a photoresist, while the photoresist on the common electrode metal layer not to be reserved is removed; the unwanted common electrode metal layer is etched off via an etching step, and the remaining common electrode metal layer will be the patterned common electrode 202 that is needed.

The common electrode metal layer is made of tin indium oxide (ITO), and the process for forming the common electrode metal layer may be a sputtering process or other processes known by one skilled in the art.

Step 2: forming a gate pattern.

Figure 2:
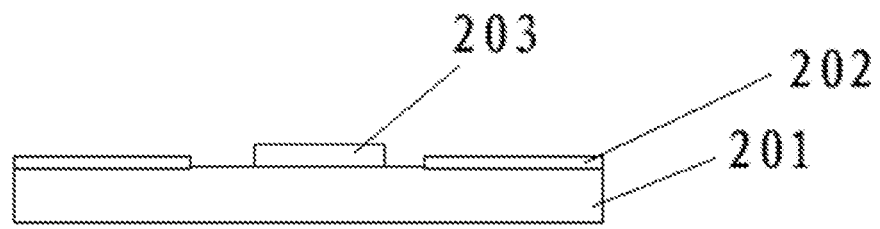
FIG. 2 shows a structural representation of a TFT array substrate according to an embodiment of the invention after a gate electrode pattern is formed.

This step may be realized by any prior art that may be implemented via a one-time patterning process. For example, it may be realized via a normal masking process; as shown in FIG. 2, a gate metal layer (not shown) on a base substrate 201 may be patterned with the aid of a normal mask (not shown) to form a pattern comprising a gate electrode 203. Specifically, it includes: depositing a gate metal layer on a substrate, and exposing, developing and etching via a normal mask to obtain a pattern of a gate electrode 203.

A normal (conventional) mask refers to a mask with a light transmitting region and a light shielding region that is generally used. After a photoresist layer formed on a gate metal layer is exposed and developed with the aid of a first conventional mask, the gate metal layer to be reserved is covered with a photoresist, while the photoresist on the gate metal layer not to be reserved is removed. The unwanted gate metal layer is etched off via an etching step, and the remaining gate metal layer will be the patterned gate 203 that is needed.

The process for forming a gate metal layer may be a sputtering process or other processes known by one skilled in the art.

Step 3: forming a gate insulating layer 204, a semiconductor active layer 205, a doped semiconductor active layer 211 and a channel region 206, and implanting ions for lowering the TFT leakage current into the surface of the semiconductor active layer 205 in the channel region to form an ion implanted layer 210.

Figure 3:
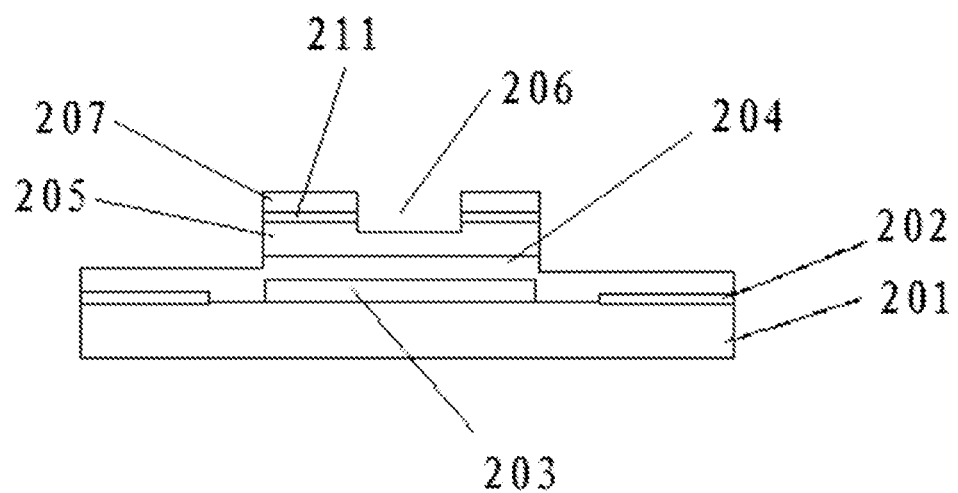
FIG. 3 shows a structural representation of a TFT array substrate according to an embodiment of the invention after a channel region is formed.

As shown in FIG. 3, $SiN_x$ and a-Si:H are deposited via chemical vapor deposition respectively as a gate insulating layer 204 and a semiconductor active layer 205, then a source-drain metal layer 207 is deposited via sputtering, a photoresist is coated on the source-drain metal layer 207, and a doped semiconductor active layer 211 is provided between the source-drain metal layer 207 and the semiconductor active layer 205. The doped semiconductor active layer is a phosphorus-doped semiconductor active layer ($n^+$a-Si), and it is located between the active layer and the source-drain metal layer for lowering the contact resistance.

The photoresist is exposed and developed via a gray-tone or half-tone mask to form a completely removed region, and a completely reserved region corresponding to a source electrode and a drain electrode, and a partially reserved region corresponding to a channel region; then, a semiconductor active layer 205, a doped semiconductor active layer 211 and a source-drain metal layer 207 in the completely removed region are etched off, and the photoresist in the partially reserved region is removed; and then the source-drain metal layer 207 and the doped semiconductor active layer 211 in the partially reserved region are first etched off to form a channel region 206 of the thin-film transistor.

During the process of this step, the thickness of the a-Si:H layer of semiconductor active layer in the TFT channel part and the component of the semiconductor active layer film will play a critical role in the properties of the TFT. For the a-Si:H layer part of the TFT channel, back channel processing is required to improve the properties of the TFT (for example, lowering the illumination leakage current, i.e., photo $I_{off}$).

Figure 4:
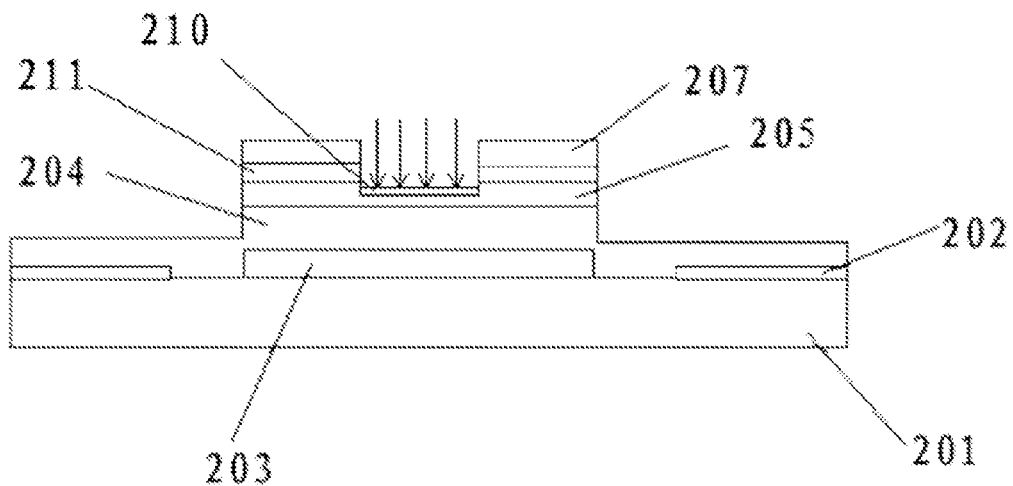
FIG. 4 is a schematic diagram showing the ion implantation in a channel region of the TFT array substrate according to an embodiment of the invention.

Before peeling off the photoresist in the completely reserved region corresponding to the source electrode and the drain electrode, in the channel region, N ions are implanted into the a-Si:H layer in the channel region (the semiconductor active layer 205) via ion implantation, so that the component of a part of the film layer on the surface of the a-Si:H layer is converted into SiNx, thus the stability of the channel surface layer may be improved. The thickness of the a-Si:H layer in the channel region may be changed controllably by changing the energy of the implanted ions. Moreover, by regulating the ratio of ions implanted, the ratio of Si—H bonds to N—H bonds may be adjusted, and the problem of too large illumination leakage current (photo $I_{off}$) may be overcome, and the electrical performance of the TFT at the channel may be improved by TFT Ion, while the electrical performance and film quality of other film layers will not be changed too much, thereby the object of improving the TFT performance may be attained. In FIG. 4, the direction of arrow represents the location of ion implantation.

The principle of lowering the TFT leakage current by implant N ions in this embodiment is as follows:

In the method for manufacturing a TFT array substrate according to the embodiment of the invention, the normal mask process will not be changed, and ions for lowering the TFT leakage current will be implanted into the channel region, thus the electrical performance of the TFT will be improved. Especially, before peeling off the photoresist in the completely reserved region corresponding to the source electrode and the drain electrode, ions will be implanted into the channel region, so that other film layers will not be influenced. In the channel region, N ions are implanted into the a-Si:H layer (semiconductor active layer) in the channel region via ion implantation, and the implanted N ions convert the component of a part of the film layer on the surface of the a-Si:H layer into SiNx, thus the stability of the channel surface layer may be improved. Because the H in the a-Si:H layer may diffuse in the a-Si:H layer, it tends to cause the breaking of weak Si—Si bonds and the aggregating of H, and different reactions may occur after illumination; as a result, defects may occur internally, and the performance of the film may be lowered, thereby a photo leakage current may be generated. The deterioration of the performance of the semiconductor active layer, i.e., the a-Si:H layer, is related to the Si—Si weak bonds, as a result, in order to improve the stability, it should eliminate or reduce the Si—Si bonds with weak bonding energy as much as possible. Therefore, N ions are introduced into the a-Si:H layer, so that the Si—Si bonds with weak bonding energy will be broken, and Si—N bonds with relatively strong bonding energy will be formed, thereby the ratio of Si—Si bonds contained in the a-Si:H layer may be lowered, and the object of stabilizing the film quality may be attained. As a result, the object of improving the electrical stability of the TFT may be attained.

Moreover, the thickness of the a-Si:H layer may be adjusted and controlled by changing the energy of the implanted ions; because when the energy of the implanted ions is different, the depth in the film layer that the ions can reach will be different, thus a SiNx layer (ion implanted layer 210) with a controllable thickness will be formed, so that the object of controllably changing the thickness of the ion implanted layer 210 of the a-Si:H layer in the channel region may be attained. At the same time, the object of regulating the ion ratio in the a-Si:H layer may be attained; because the N ions implanted will cause the atoms in the film layer to rebind, and the content of the N ions implanted can adjust the ratio of Si—H bonds to N—H bonds, and the problem of too large illumination leakage current (photo $I_{off}$) may be overcome. The electrical performance of the TFT at the channel may be improved by TFT Ion, while the electrical performance and film quality of other film layers will not be changed too much, thereby the object of improving the TFT performance may be attained.

Moreover, the energy of implanted ions during ion implantation is in the range form 20 KV to 80 KV, but it is not limited hereto.

Moreover, the dosage of implanted ions during ion implantation is in the range from $2 \times 10^{17}/cm^2$ to $5 \times 10^{18}/cm^2$, but it is not limited hereto.

The invention further provides a thin-film transistor, which is manufactured by the above method for manufacturing a thin-film transistor.

Moreover, when the ions are N ions, the contents of Si, H and N contained in the ion-implanted part of the semiconductor active layer are 30 mol %-50 mol %, 4 mol %-15 mol % and 35 mol %-60 mol %, respectively.

Moreover, when the ions are C ions, the contents of Si, H and C contained in the ion-implanted part of the semiconductor active layer are 30 mol %-50 mol %, 4 mol %-15 mol % and 40 mol %-60 mol %, respectively.

The ions may be N ions, or C ions or H ions; or, the ions may be other ions, so long as the Si—Si bonds may be broken to avoid that defects occur inside the semiconductor active layer and the performance of the film is lowered.

In this embodiment, the principle of lowering the TFT leakage current by implanting H ions is as follows: the ratio of Si content to H content may be changed by implanting H ions, and for a non-doped a-Si film (semiconductor active layer), the density of dangling bonds is very high, and the electrical property is poor, so it cannot meet the application requirement as a device; the introduction of H ions may saturate or partially saturate the defect state of dangling bonds in the film, and the content of H ions in an active conductive layer (semiconductor active layer) may be further regulated by implanting H ions via ion implantation, so that the density of dangling bonds may be lowered, and the object of stabilizing the film quality may be attained, thereby the object of improving the electrical stability of the TFT may be attained.

Step 4: forming a pattern, which includes a passivation layer 208 with a contact hole, on the pattern of the source electrode and the drain electrode.

As shown in FIG. 4, a passivation layer 208 is deposited on a substrate 201 on which the second patterning process has been accomplished. Specifically, a passivation layer 208 with a thickness of 2000-5000 Å may be deposited via chemical vapor deposition, and the material of the passivation layer 208 may be an oxide, a nitride or a oxynitride, the passivation layer 208 may have a monolayer structure or a multilayer structure, and the corresponding reacting gas may be $SiH_4$, $NH_3$ and $N_2$ or $SiH_2Cl_2$, $NH_3$ and $N_2$. A photoresist is coated on the passivation layer, and the photoresist is exposed and developed via a mask, and then the photoresist is etched to form a pattern that includes a passivation layer 208 with a contact hole.

Step 5: forming a pattern of a pixel electrode 209 on the passivation layer, wherein the pixel electrode 209 is connected with the drain electrode via a contact hole.

Figure 5:
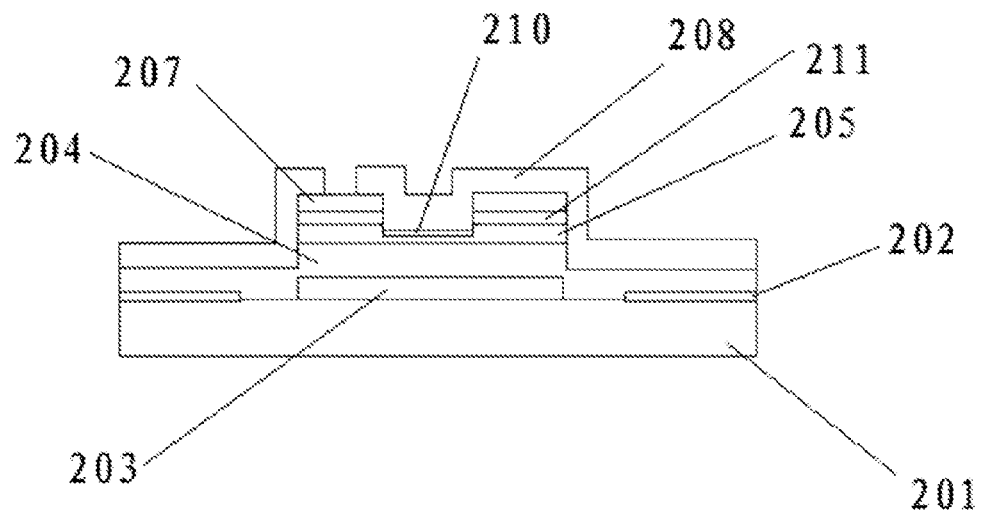
FIG. 5 shows a structural representation of a TFT array substrate according to an embodiment of the invention after a passivation layer is formed.
Figure 6:
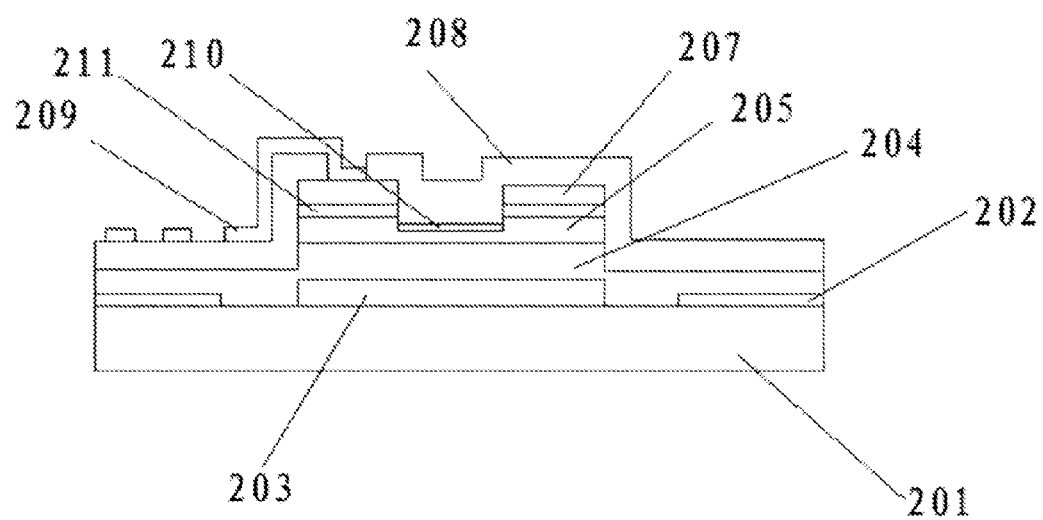
FIG. 6 shows a structural representation of a TFT array substrate according to an embodiment the invention after a pixel electrode is formed.

Specifically, as shown in FIG. 5, a transparent conductive layer with a thickness of 300-1500 Å may be deposited via sputtering or heat evaporation on the substrate 201 formed with the passivation layer 208. The material of the transparent conductive layer may be ITO or IZO, or other transparent metal oxide. A photoresist is coated on the transparent conductive layer, and the photoresist is exposed and developed via a mask, and then the photoresist is etched to form a pixel electrode 209, wherein the pixel electrode 209 is connected with the drain electrode via a contact hole.

The above description only shows some preferred embodiments of the invention. It should be noted that, various modifications and improvements may also be made by one of ordinary skills in the art without departing from the spirit and scope of the invention. Therefore, all these modifications and improvements should be construed as pertain to the protection scope of the invention.

What is claimed is:

1. A method for manufacturing a thin-film transistor (TFT), comprising the steps of:
   forming a semiconductor active layer and a doped semiconductor active layer;
   forming a source-drain metal layer, wherein the doped semiconductor active layer is provided between the source-drain metal layer and the semiconductor active layer;
   forming a channel region; and
   implanting ions for lowering a TFT leakage current into a surface layer of the semiconductor active layer in the channel region via N ions or C ions implantation after forming the channel region and before peeling off a photoresist on a surface of the source-drain metal layer, so that film layers other than the semiconductor active layer and the doped semiconductor active layer are not changed by implanting ions.

2. The method according to claim 1, wherein when the ions are N ions, contents of Si, H and N contained in an ion-implanted part of the semiconductor active layer are 30 mol %-50 mol %, 4 mol %-15 mol % and 35 mol %-60 mol %, respectively.

3. The method according to claim 1, wherein when the ions are C ions, contents of Si, H and C contained in an ion-implanted part of the semiconductor active layer are 30 mol %-50 mol %, 4 mol %-15 mol % and 40 mol %-60 mol %, respectively.

4. The method according to claim 1, wherein the method comprises:
   depositing a gate metal layer on a substrate, and obtaining a gate electrode pattern via a patterning process; and
   depositing a gate insulating layer, the semiconductor active layer, the doped semiconductor active layer and the source-drain metal layer on the gate electrode pattern, obtaining the channel region and a pattern of a source electrode and a drain electrode via a patterning process, and implanting the ions for lowering the TFT leakage current into the surface layer of the semiconductor active layer in the channel region via ion implantation before peeling of a photoresist on the pattern of the source electrode and the drain electrode, so that the film layers other than the semiconductor active layer and the doped semiconductor active layer are not changed by implanting ions.

5. The method according to claim 1, wherein the method comprises:
   depositing the source-drain metal layer on a substrate, and obtaining a pattern of a source electrode and a drain electrode via a patterning process;
   forming the doped semiconductor active layer and the semiconductor active layer on the source electrode and the drain electrode, and forming the channel region via a patterning process; and
   implanting the ions for lowering the TFT leakage current into the surface layer of the semiconductor active layer in the channel region via ion implantation and before peeling off the photoresist on a surface of the source-drain metal layer, so that the film layers other than the semiconductor active layer and the doped semiconductor active layer are not changed by implanting ions.

6. The method according to claim 1, wherein an energy of the implanted ions is 20 KV.

7. The method according to claim 1, wherein a dosage of the implanted ions is in a range from $2\times10^{17}/cm^2$ to $5\times10^{18}/cm^2$.

8. A method for manufacturing a thin-film transistor (TFT), comprising the steps of:
   forming a semiconductor active layer and a doped semiconductor active layer;
   forming a source-drain metal layer, wherein the doped semiconductor active layer is provided between the source-drain metal layer and the semiconductor active layer;
   forming a channel region; and
   implanting ions for lowering a TFT leakage current into a surface layer of the semiconductor active layer, which is made of amorphous silicon a-Si:H in the channel region via N ions or C ions implantation after forming the channel region and before peeling off a photoresist on a surface of the source-drain metal layer, so that film layers other than the semiconductor active layer and the doped semiconductor active layer are not changed by implanting ions.

9. The method according to claim 8, wherein when the ions are N ions, contents of Si, H and N contained in an ion-implanted part of the semiconductor active layer are 30 mol %-50 mol %, 4 mol %-15 mol % and 35 mol %-60 mol %, respectively.

10. The method according to claim 8, wherein when the ions are C ions, contents of Si, H and C contained in an ion-implanted part of the semiconductor active layer are 30 mol %-50 mol %, 4 mol %-15 mol % and 40 mol %-60 mol %, respectively.

11. The method according to claim 8, wherein the method comprises:
   depositing a gate metal layer on a substrate, and obtaining a gate electrode pattern via a patterning process; and
   depositing a gate insulating layer, the semiconductor active layer, the doped semiconductor active layer and the source-drain metal layer on the gate electrode pattern, obtaining the channel region and a pattern of a source electrode and a drain electrode via a patterning process, and implanting the ions for lowering the TFT leakage current into the surface layer of the semiconductor active layer in the channel region via ion implantation before peeling off a photoresist on the pattern of the source electrode and the drain electrode, so that the film layers other than the semiconductor active layer and the doped semiconductor active layer are not changed by implanting ions.

12. The method according to claim 8, wherein the method comprises:
   depositing the source-drain metal layer on a substrate, and obtaining a pattern of a source electrode and a drain electrode via a patterning process;
   forming the doped semiconductor active layer and the semiconductor active layer on the source electrode and the drain electrode, and forming the channel region via a patterning process; and
   implanting the ions for lowering the TFT leakage current into the surface layer of the semiconductor active layer in the channel region via ion implantation, so that the film layers other than the semiconductor active layer and the doped semiconductor active layer are not changed by implanting ions.

13. The method according to claim 8, wherein an energy of the implanted ions is 20 KV.

14. The method according to claim 8, wherein a dosage of the implanted ions is in a range from $2\times10^{17}/cm^2$ to $5\times10^{18}/cm^2$.

* * * * *